United States Patent
Murtuza

(10) Patent No.: US 7,642,649 B2
(45) Date of Patent: Jan. 5, 2010

(54) SUPPORT STRUCTURE FOR LOW-K DIELECTRICS

(75) Inventor: Masood Murtuza, Sugarland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/726,474

(22) Filed: Dec. 1, 2003

(65) Prior Publication Data
US 2005/0116345 A1 Jun. 2, 2005

(51) Int. Cl.
*H01L 23/52* (2006.01)
(52) U.S. Cl. .................... 257/758; 257/774
(58) Field of Classification Search .......... 257/700, 257/758, 774
See application file for complete search history.

(56) References Cited

U.S. PATENT DOCUMENTS

| | | | | |
|---|---|---|---|---|
| 3,427,247 | A * | 2/1969 | Peck | 252/75 |
| 5,970,319 | A | 10/1999 | Banks et al. | |
| 6,175,161 | B1 | 1/2001 | Goetz et al. | |
| 6,198,170 | B1 * | 3/2001 | Zhao | 257/784 |
| 6,204,165 | B1 * | 3/2001 | Ghoshal | 438/619 |
| 6,586,839 | B2 | 7/2003 | Chisholm et al. | |
| 6,602,733 | B2 | 8/2003 | Iwahashi et al. | |
| 6,650,010 | B2 * | 11/2003 | Davis et al. | 257/700 |
| 2002/0038903 | A1 * | 4/2002 | Tsau | 257/532 |
| 2002/0167282 | A1 * | 11/2002 | Kirkpatrick et al. | 315/248 |
| 2002/0175362 | A1 * | 11/2002 | McTeer | 257/306 |
| 2003/0197280 | A1 * | 10/2003 | Davis et al. | 257/774 |
| 2004/0253801 | A1 * | 12/2004 | Lin | 438/612 |

OTHER PUBLICATIONS

Clarke, Michael E., Introducing Low-k Dielectrics into Semiconductor Processing, Jan. 2002, Mykrolis, URL: http://www.mykrolis.com/publications.nsf/dda0cb48c91c0fb6852567430063b5d6/dcc71529daa48c5e85256c4800744cf0/$FILE/Mal123.pdf.*
K. Buchanan, et al., "Challenges Associated with the Integration of Nano-Porous Ultra Low k CVD Films", SEMI Technical Symposium, p. 1-2, 2002.
L. Peters, "Removing Barries to Low-k Dielectric Adoption", http://www.reed-electronics.com/semiconductor/index.asp?layout=articlePring&..., Last Viewed Aug. 26, 2003, p. 1.
International SeMaTech, "Benchmarking Ultra Low-K Materials: Nanoglass Shows Promise", http://www.sematech.org/public/news/stories/nanoglass.com, Last Viewed Aug. 26, 2003, p. 1-2
"Axcelis, Dow Coming Develop Porous Ultra-Low-K Process", http://www.reed.electronics.com/electronicsnews/index.asp?layout=articlePrint&..., Last Viewed Aug. 26, 2003, p. 1.
"Nanoporous Ultra-Low Dielectric Constant Materials", http://www.ncnr.nist.gov/programs/reflectometry/highlights/nano/, Last Viewed Aug. 26, 2003, p. 1-3.

* cited by examiner

*Primary Examiner*—Thomas L Dickey
(74) *Attorney, Agent, or Firm*—Warren L. Franz; Wade J. Brady, III; Frederick J. Telecky, Jr.

(57) ABSTRACT

A semiconductor device employs a support structure to mitigate damage to dielectric layers having a low dielectric constant (k). The semiconductor device includes at least one inter-level dielectric layer (ILD) comprising a material having a low dielectric constant (k), and at least one support structure disposed within the low-k dielectric layer. The support structure mitigates damage of the semiconductor device by providing a mechanically stable interface between two layers in the semiconductor device.

18 Claims, 7 Drawing Sheets

SUPPORT STRUCTURE FOR LOW-K DIELECTRICS

TECHNICAL FIELD

The present invention relates to semiconductor devices and, more particularly, to a support structure for low-k dielectrics that can be used in semiconductor devices.

BACKGROUND OF THE INVENTION

In the semiconductor industry, there is a continuing trend toward higher device densities. To achieve these high densities, there has been and continues to be efforts toward scaling down device dimensions to submicron levels (e.g., below 0.35 microns) on semiconductor substrates. In order to accomplish such high device density, smaller features sizes are required. The smaller feature sizes may include the width and spacing of metal interconnecting lines, spacing and diameter of contact holes, width of interlayer dielectric materials, and the surface geometry, such as corners and edges of various features.

Dielectric materials used in film layers can directly affect the performance (e.g., operational speed) of the semiconductor device. Silicon dioxide ($SiO_2$) has been typically used as an interlayer dielectric material (ILD). $SiO_2$ has, however, been replaced with other dielectric materials with a lower dielectric constant (k) to achieve greater device operational speeds. Reducing the dielectric constant of the dielectric material reduces capacitive losses between adjacent conductors because the dielectric material stores less electric field and, therefore, takes less time to charge. This allows for an increase in speed performance of the adjacent conductors. Low-k dielectrics, however, can be potentially prone to damage due to stresses induced during formation and after packaging of the semiconductor device since low-k dielectrics can be structurally weak.

SUMMARY OF THE INVENTION

The present invention relates to a semiconductor device that employs a support structure to mitigate damage to dielectric layers having a low dielectric constant (k). In one aspect of the present invention, a semiconductor device is provided. The semi-conductor device includes a substrate, at least one inter-level dielectric (ILD) layer made from a material having a low dielectric constant (k) disposed over the substrate, and at least one support structure disposed in the ILD layer. The at least one support structure mitigates damage to the semiconductor device caused by stresses to the ILD layer. The low-k dielectric material can have a dielectric constant (k) in the range of about 1.0 to about 3.8 as measured at 25° C. Alternatively, the ILD layer can be formed from an ultra low-k material. The ultra low-k dielectric material has a dielectric constant (k) in the range of the low-k dielectric material. For example, the ultra low-k dielectric material can have a dielectric constant in the range of about 1.0 to about 2.7, as measured at 25° C.

In another aspect of the present invention, a method is provided for forming a semiconductor device. The method includes providing a substrate and forming a low-k inter-level dielectric (ILD) layer over the substrate. At least one opening is formed in the low-k ILD layer. The at least one opening is filled with a support material to form a support structure in the low-k ILD layer. The support structure mitigates damage to the semiconductor device caused by stresses to the low-k ILD layer.

In yet another aspect of the present invention, a method is provided for reinforcing a semiconductor device to mitigate damage of the semiconductor device that can potentially be caused by processing or packaging the semiconductor device. The method includes forming an inter-level dielectric (ILD) layer over a substrate. The ILD layer can be formed from a dielectric material having a dielectric constant (k) in the range of about 1.0 to about 3.8 as measured at 25° C. A support structure is formed by filling an opening in the ILD layer with support material. Alternatively, the dielectric material can have a dielectric constant (k) in the range of about 1.0 to about 2.7 as measured at 25° C.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

Figure 1:
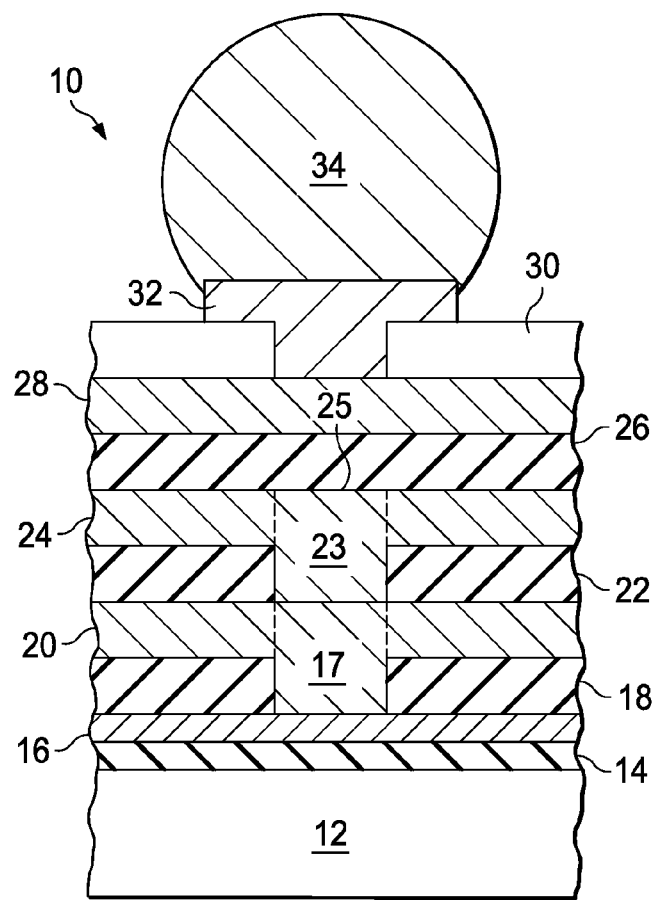
FIG. 1 illustrates a schematic cross-sectional view of a semiconductor device in accordance with an aspect of the present invention.

The present invention relates to a semiconductor device that employs a support structure to mitigate damage due to stresses induced to the semiconductor device. The semiconductor device includes at least one inter-level dielectric (ILD) layer and at least one support structure disposed within the inter-level dielectric layer. The support structure can comprise a via or trench filled with a support material (e.g., aluminum, aluminum alloy, copper, copper alloy, tungsten, tungsten alloy), and the ILD layer can comprise a low-k dielectric material or an ultra-low-k dielectric material.

A low-k dielectric material is referred to herein as a dielectric material that has a dielectric constant (k) less than or equal to about 3.8 as measured at 25° C. For example, the low-k dielectric materials can have a dielectric constant in the range of about 1.0 to about 3.8, as measured at 25° C. Low-k dielectric materials are typically more brittle than dielectric materials that have a dielectric constant higher than about 3.8 (e.g., silicon dioxide dielectric constant (k) about 4.0). Examples of low-k dielectric materials are spin-on-dielectrics (SOD), such as hydrogen silsesquioxane (HSQ), whose dielectric constant is about 2.9, silicon oxyfluoride, $Si_xOF_y$, whose dielectric constant is about 3.3 to about 3.8, and a-CF (fluorinated amorphous carbon or FLAC) whose dielectric constant is about 2.8. Although these specific examples have been identified, it is to be appreciated that any dielectric material having a dielectric constant in the range of about 1.0 to about 3.8 can be considered a low-k dielectric material in accordance with an aspect of the invention.

An ultra low-k dielectric material can have a dielectric constant range that can be within the dielectric constant range of the low-k dielectric material. The dielectric constant range for the ultra-low-k dielectric material can be in the range of about 1.0 to about 2.7, as measured at 25° C. Ultra-low-k dielectric materials can include non-porous, templated-composite materials, inorganic/organic hybrids, and solgels (e.g., aliphatic tetrafluorinated poly-p-xylylene (Parylene AF4), whose dielectric constant is about 2.5, or organosilicate glass (OSG), whose dielectric constant is about 2.7 ). Ultra-low-k dielectric materials can also be formed from dielectric materials in which air or pores are incorporated into the dielectric material (e.g., nanoporous silica whose dielectric constant is about 1.3 to about 2.2). Introducing porosity into a dielectric material, however, can adversely affect the structural properties of the dielectric material. Although these specific examples of ultra-low-k dielectric materials have been identified, it is to be appreciated that any dielectric material having a dielectric constant in the range of about 1.0 to about 2.7 can be considered an ultra low-k dielectric material in accordance with an aspect of the invention.

An ILD layer formed from either a low-k dielectric material or an ultra-low-k dielectric material can be potentially prone to damage if stress is applied to the semiconductor device since both low-k dielectrics and ultra low-k dielectrics can be structurally weak. Examples of stress that can potentially cause damage to the ILD layer include stress induced during and after packaging of the semiconductor device and stress induced during processing when forming additional layers of the semiconductor device.

The support structure can mitigate damage to the ILD layer of the semiconductor device by providing a mechanically stable interface between two layers in the semiconductor device, for example, a metal interconnect layer and the substrate. The support structure can take up mechanical force applied to the semiconductor device so that the ILD layer does not generally participate in load bearing.

Although the present embodiments will be discussed with respect to low-k dielectric layers, the low-k dielectric layers are meant to include ultra low-k dielectric layers.

FIG. 1 illustrates a cross-sectional view of a semiconductor device 10 in accordance with an aspect of the present invention. The semiconductor device includes a substrate 12. An oxide layer 14 is located on the substrate 12. A conductive layer 16 is located on the oxide layer 14.

A first low-k dielectric layer 18 is located on the conductive layer 16. At least one support structure 17 resides in the first low-k dielectric layer 18. The at least one support structure 17 in the first low-k dielectric layer is formed from a support material (e.g., aluminum, aluminum alloy, copper, copper alloy, tungsten, and tungsten alloy) that is structurally stronger than the first low-k dielectric layer 18. A first conductive layer 20 is located on the first low-k dielectric layer 18. A second low-k dielectric layer 22 is located on the conductive layer 20. At least one support structure 23 resides in the second low-k dielectric layer 22. The at least one support structure 23 in the second low-k dielectric layer 22, like the at least one support material in the first low-dielectric layer, is formed from a support material (e.g., aluminum, aluminum alloy, copper, copper alloy, tungsten, or tungsten alloy) that is structurally stronger than the second low-k dielectric layer 22. A second conductive layer 24 resides over the second low-k dielectric layer 22.

A dielectric layer 26 resides over the conductive layer 24, and a third conductive layer 28 is located on the dielectric layer 26. The dielectric layer 26 is not a low-k dielectric layer but is made of a material with a higher dielectric constant (k) and is structurally stronger. A protective overcoat 30 (e.g., silicon oxynitride) is located over the third conductive layer 28. A bond pad 32 is provided in an opening formed in the protective overcoat 30. A solder bump 34 made of, for example of aluminum, gold, or silver, resides the bond pad 32. The at least one support structures 17 and 23 in the low-k dielectric layers 18 and 22 are aligned underneath the bond pad 32.

The at least one support structure 17, the at least one support structure 23, and conductive layers 20 and 24 form a support system 25. The support system 25 can be in the form of one or more support columns. In FIG. 1, a single support column is illustrated for simplicity and clarity. The support system 25 takes up stress (e.g., mechanical force) applied to the semiconductor device 10 during the fabrication process as well as during the packaging process so that damage to the low-k dielectric layers 18 and 22 can be mitigated.

For example, one of the functions of a bond pad is to provide a connection surface from contacts of the semiconductor device to electrical connections in the lead frame package during a packaging process known as wire bonding. Another function of a bond pad is to provide a connection surface to connect the semiconductor contacts to contacts in a circuit board during a packaging process known as flip chip. In both packaging processes, the bond pad receives a solder bump during packaging of the semiconductor device, and formation of the solder bump provides a source of stress to the semiconductor device. Alternatively, the solder bump 34 is not required to be formed on the bond pad 32 if the particular packaging process does not involve solder bump formation.

Low-k dielectric layers, while being necessary in the fabrication process for producing a high performance semiconductor device, can be structurally weak. The stresses applied to the semiconductor device during formation of the solder bump can lead to cracks or other damage in the low-k dielectric layers. The cracks can spread throughout the semiconductor device and may damage the semiconductor. The support system takes up stress that is applied to the semiconductor device so that the low-k dielectric layers' participation in load bearing for the semiconductor device is substantially minimized. Thus, the support system can mitigate potential damage (e.g., cracks) to the low-k dielectric layers.

It should be appreciated that the support system can also mitigate damage to the low-k dielectric layers from other sources of stress applied to the semiconductor device, such as sources of stress induced during flip chip reflow, die attach, wafer sawing, integrated circuit pick and place, integrated circuit PCB (printed circuit board) connections, ceramic encapsulation, shipping and normal consumer use.

Figure 2:
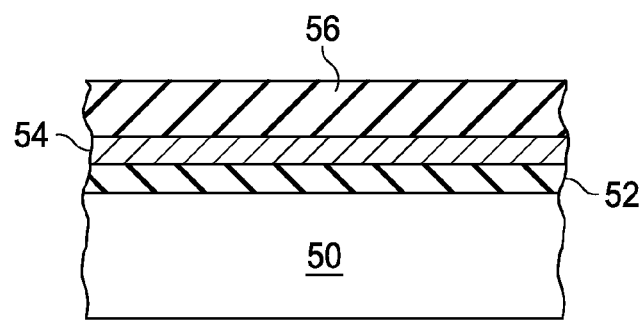
FIG. 2 illustrates a schematic cross-sectional view of a low-k inter-level dielectric (ILD) layer, a conductive layer, and a plasma oxide layer disposed over a substrate in accordance with an aspect of the present invention.

FIGS. 2-9 illustrate a methodology of fabricating a semiconductor device that includes a support structure system in accordance with an aspect of the present invention. FIG. 2 illustrates a plasma oxide layer 52 formed on a substrate 50. A conductive layer or metal interconnect layer 54 formed from (e.g., aluminum, aluminum alloy, copper, copper alloy, tungsten, tungsten alloy) is deposited over the plasma oxide layer 52 by employing any suitable metal deposition technique, such as metal chemical vapor deposition (CVD), sputtering, copper electroplate, and evaporation techniques. It is to be appreciated, however, that the present invention is applicable to other types of thin film formation, such as other deposition techniques, for example, physical vapor deposition (PVD), metal organic chemical vapor deposition (MOCVD), pulsed laser deposition (PLD), or film growth techniques. The conductive layer 54 can be planarized by a chemical mechanical polish (CMP) or other suitable planarizing technique such as an etch.

FIG. 2 also illustrates a first low-k dielectric layer 56 formed over the metal interconnect 54. The first low-k dielectric layer 56 can be formed using any suitable method including epitaxy, CVD, low pressure chemical vapor deposition (LPCVD), plasma enhanced chemical vapor deposition (PECVD), high density plasma chemical vapor deposition (HDPCVD), sputtering, spin-on-glass (SOG), and spin-on-dielectrics (SOD).

Figure 3:
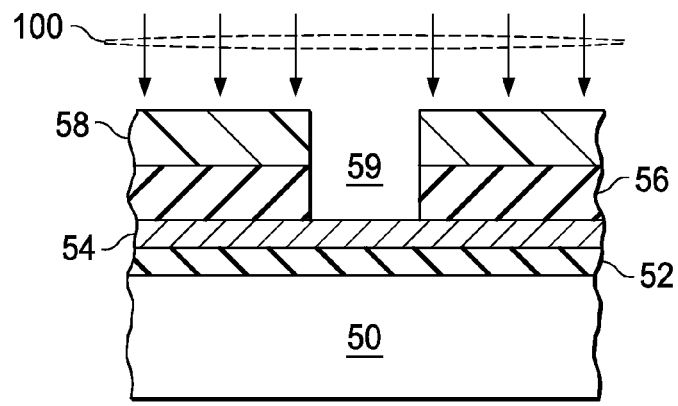
FIG. 3 illustrates a schematic cross-sectional view of the structure of FIG. 2 undergoing an etch step in accordance with an aspect of the present invention.

FIG. 3 illustrates a patterned photoresist layer 58 deposited over the first low-k dielectric layer 56. The patterned photoresist layer 58 is used to define an opening 59 in the form of either a via or a trench in the first low-k dielectric layer 56 during an etching process 100. The etch process 100 may be performed using an appropriate wet chemistry or an appropriate dry chemistry. The appropriate wet or dry etch chemistry is highly selective to the first low-k dielectric layer 56 over the underlying conductive layer 54.

Although not shown, the photoresist layer 58 may be used to define at least one additional via or trench for forming an electrical interconnection between two conductive layers. Therefore, the opening 59 can be formed concurrently with other features of the semiconductor device without additional processing steps.

Figure 4:
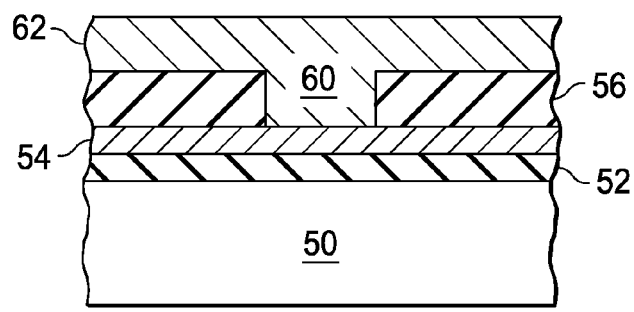
FIG. 4 illustrates a schematic cross-sectional view of the structure of FIG. 3 after deposition of a second conductive layer in accordance with an aspect of the present invention.

FIG. 4 illustrates the resultant structure after the etch 100 is performed, the remaining patterned photoresist 58 is stripped (e.g., ashing in an $O_2/H_2O$ plasma or other suitable technique), and a conductive layer 62 formed from (e.g., aluminum, aluminum alloy, copper, copper alloy, tungsten, or tungsten alloy) is deposited on the first low-k dielectric layer 56. The conductive material of the conductive layer 62 is structurally stronger than the first low-k dielectric material layer 56. The conductive layer 62 can be formed using any suitable conventional metal deposition technique such as for deposition of the conductive layer 54. The formation of the conductive layer 62 fills in the opening 59 in the first low-k dielectric layer to form a first support structure 60. The conductive layer 62 can be planarized using an appropriate technique, such as CMP, but is not planarized down to the first low-k dielectric layer 56. Alternatively, the conductive layer 62 can be planarized by any other suitable technique such as a timed etch.

Figure 5:
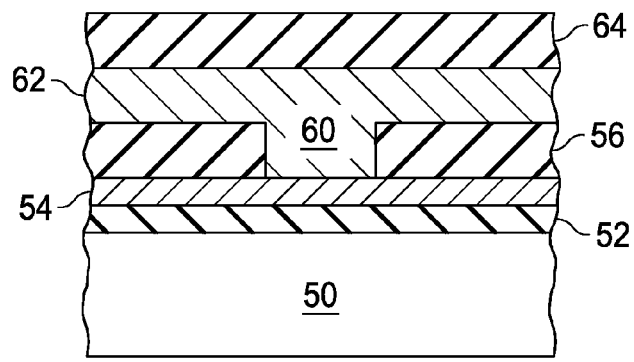
FIG. 5 illustrates a schematic cross-sectional view of the structure of FIG. 4 after deposition of a second low-k ILD layer over the second conductive layer in accordance with an aspect of the present invention.
Figure 6:
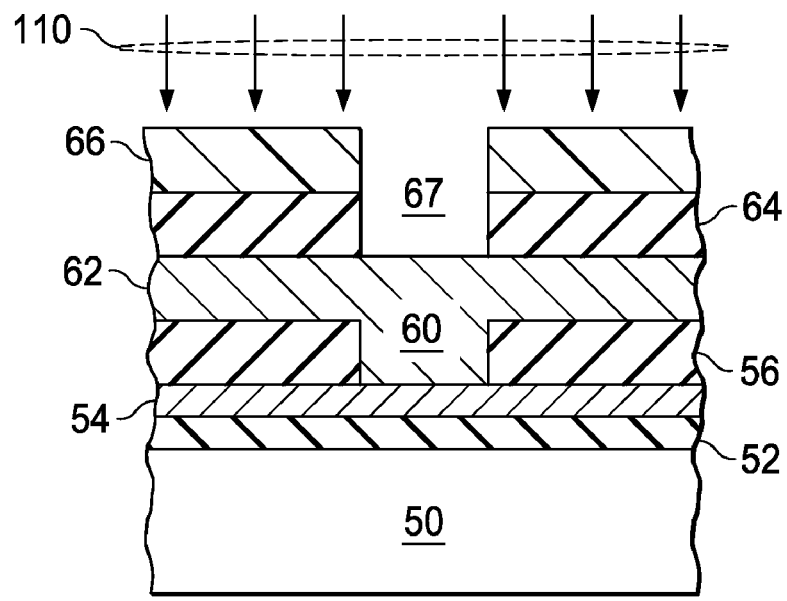
FIG. 6 illustrates a schematic cross-sectional view of the structure of FIG. 5 undergoing an etch step in accordance with an aspect of the present invention.

FIG. 5 illustrates a second low-k dielectric layer 64 deposited over the conductive layer 62. The second low-k dielectric layer 64, similar to the first low-k dielectric layer 56, can be formed using any suitable method including epitaxy, CVD, LPCVD, PECVD, HDPCVD, sputtering, SOG, and SOD. FIG. 6 illustrates a patterned photoresist layer 66 formed over the second low-k dielectric layer 64. The photoresist layer 66 is used to define an opening 67 in the form of either a via or a trench in the second low-k dielectric layer 64 during an etching process 110. The etch process 11 may be performed using appropriate wet or dry etch chemistry which is highly selective to the second low-k dielectric layer 64 over the underlying conductive layer 62. Although not shown, the photoresist layer 66 may be used to define at least one additional via or trench for forming electrical interconnection between the two conductive layers 54, 62 or for alternatively forming additional structures concurrently with the formation of the opening 67.

Figure 7:
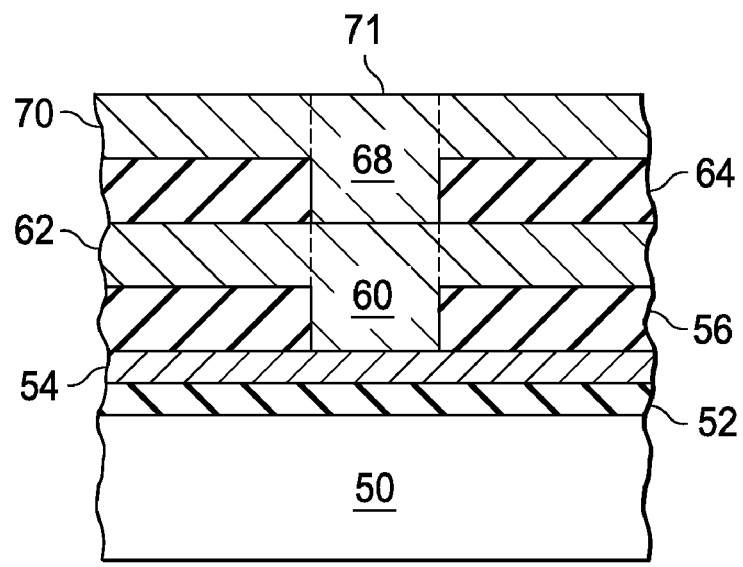
FIG. 7 illustrates a schematic cross-sectional view of the structure of FIG. 6 after deposition of a third conductive layer in accordance with an aspect of the present invention.

FIG. 7 illustrates the resultant structure after the etch 110 is performed, the remaining patterned photoresist 66 is stripped (e.g., ashing in an $O_2/H_2O$ plasma or other suitable technique) and a conductive layer 70 formed from (e.g., aluminum, aluminum alloy, copper, copper alloy, tungsten, or tungsten alloy) is deposited on the second low-k dielectric layer 64. The conductive layer 70 is formed from a material which is structurally stronger than the material of the second low-k dielectric layer 64. The conductive layer 70 can be formed using any suitable conventional metal deposition technique. The formation of the conductive layer 70 fills in the opening 67 in the second low-k dielectric layer 64 to form a second support structure 68. The conductive layer 70 can be planarized similar to conductive layers 54 and 62.

The second support structure 68 in the second low-k dielectric layer 64 overlies the first support structure 60 in the first low-k dielectric layer 56. The first support structure 60, the second support structure 68 and the conductive layers 62 and 70 form a support system or support column that mitigates damage to the first and second low-k dielectrics 56 and 64 during post fabrication processing.

Figure 8:
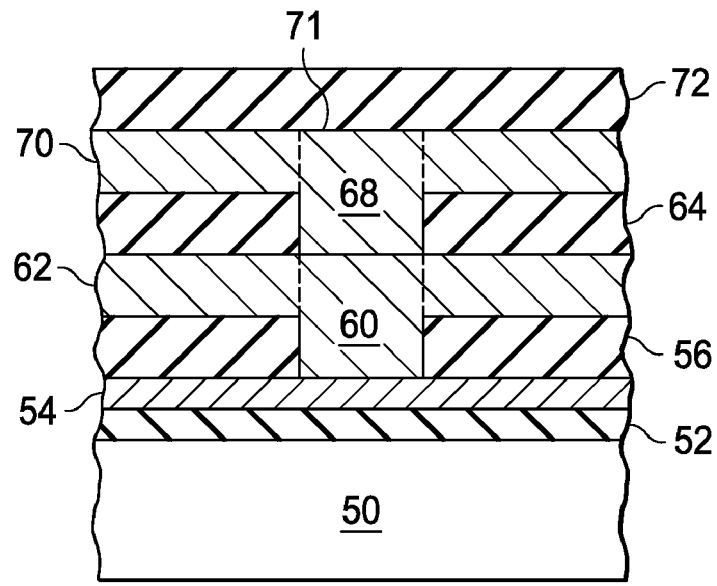
FIG. 8 illustrates a schematic cross-sectional view of FIG. 7 after deposition of a second dielectric layer in accordance with an aspect of the present invention.

FIG. 8 illustrates a dielectric layer 72 deposited over the conductive layer 70. The dielectric layer 72 is not a low-k dielectric layer and has a dielectric constant (k) which is higher than the low-k dielectric layers 56 and 64. The higher k dielectric layer is not structurally weak compared to the low-k dielectric layers 56 and 64. For example, the dielectric layer 72 can be formed from silicon dioxide or other suitable higher k dielectric material. The dielectric layer 72 can be deposited using any suitable method including CVD, LPCVD, PECVD, sputtering or HDPCVD.

Figure 9:
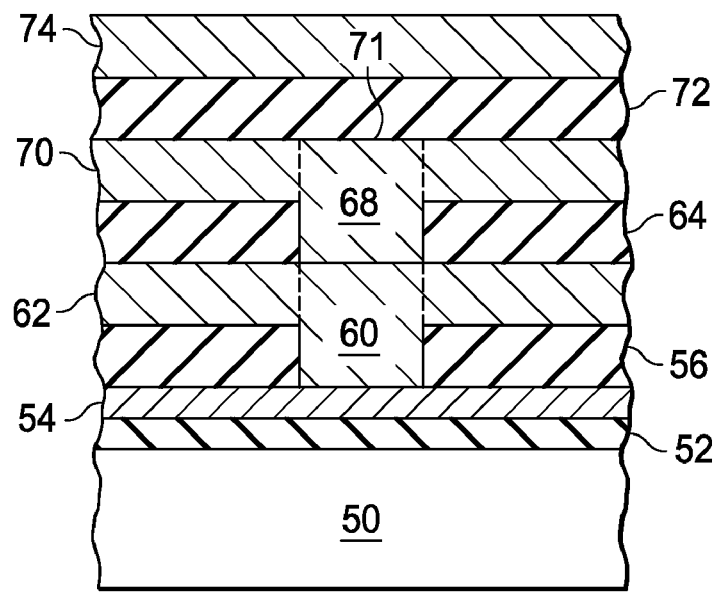
FIG. 9 illustrates a schematic cross-sectional view of the structure of FIG. 8 after deposition of a contact layer in accordance with an aspect of the present invention.
Figure 10:
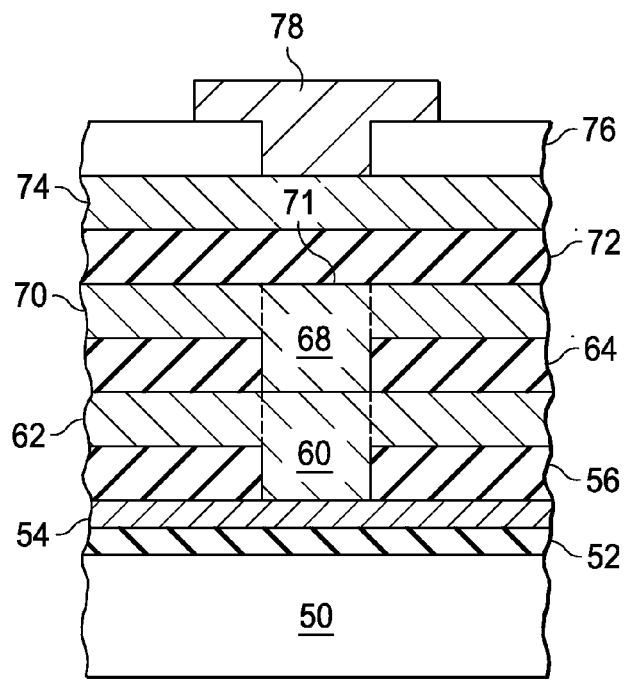
FIG. 10 illustrates a schematic cross-sectional view of the structure of FIG. 9 after formation of a protective layer and a bond pad in accordance with an aspect of the present invention.

FIG. 9 illustrates a contact layer 74 formed from (e.g., aluminum, aluminum alloy, copper, copper alloy, tungsten, or tungsten alloy) deposited on the dielectric layer 72 employing conventional metal deposition techniques. The contact layer 74 can be planarized using a CMP or other suitable planarizing technique such as an etch. FIG. 10 illustrates a protective layer 76 formed from silicon oxynitride/silicon nitride or other suitable material deposited on the contact layer 72. The protective layer 76 includes an opening. A bond pad 78 is formed in the opening in the protective layer 76. The bond pad material can be, for example, aluminum, aluminum alloy, copper, copper alloy, tungsten, or tungsten alloy. During packaging of the semiconductor device, a solder bump formed from for example, gold, silver or aluminum, is deposited overlying the bond pad 78 and the support system 71.

The resultant structure is similar to the structure illustrated in FIG. 1. In FIG. 1, the solder bump 34 is illustrated to show the overlying relationship of the solder bump 34, the bond pad 32, and the support structures 17, 23 that form the support system 25. The overlying relationship of the support system components provides a path for force or stress applied to the bond pad to travel to the substrate and by pass the structurally weak ILDs.

Figure 11:
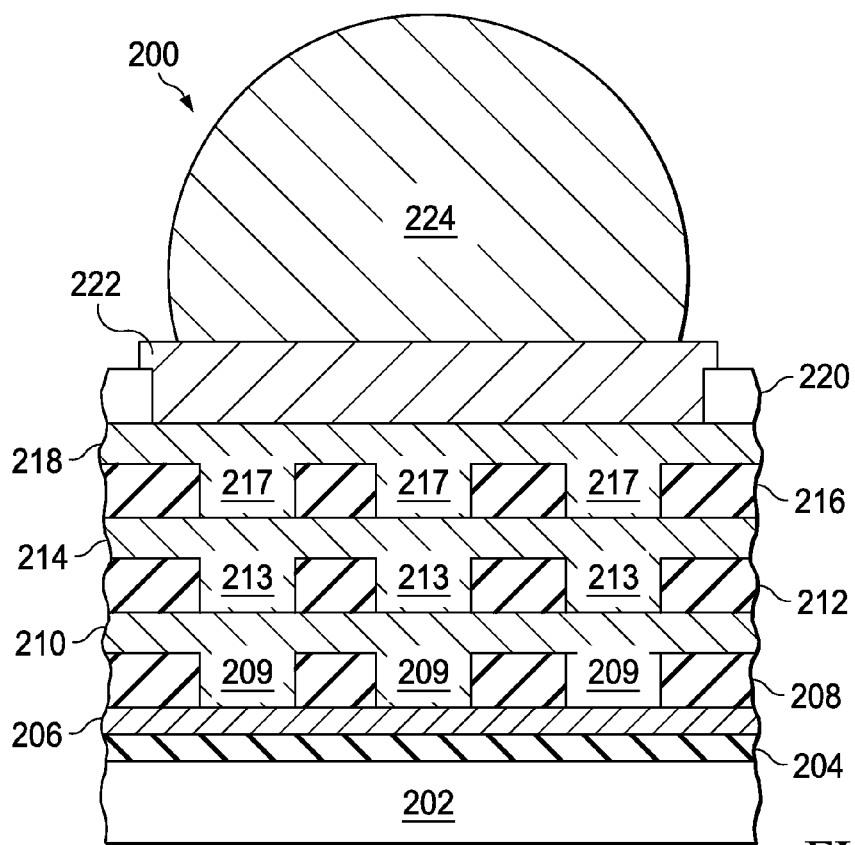
FIG. 11 illustrates a schematic cross-sectional view of a semiconductor device in accordance with another aspect of the present invention.

FIG. 11 illustrates a semiconductor device 200 having a multiple support structure arrangement in accordance with another aspect of the invention. The multiple structure arrangement provides for a plurality of support structures in one or more low-k dielectric layers disposed below a bond pad 222. A plasma oxide layer 204 resides on a substrate 202. A conductive layer 206 is located over the plasma oxide layer 204. A first low-k dielectric layer 208 resides over the conductive layer 206. The first low-k dielectric layer 208 includes a plurality of support structures 209 filled with a support material (e.g., aluminum, aluminum alloy, copper, copper alloy, tungsten, or tungsten alloy) that is structurally stronger than the first low-k dielectric layer 208. A conductive layer 210 is located over the first low-k dielectric layer 208. A second low-k dielectric layer 212 resides over the conductive layer 210. The second low-k dielectric layer 212 also includes a plurality of support structures 213 filled with a support material that is structurally stronger than the second low-k dielectric layer 212.

A conductive layer 214 resides over the second low-k dielectric layer 212. A third dielectric layer 216 is located over the conductive layer 214. The third dielectric layer is not a low-k dielectric layer, but includes a plurality of support structures 217. The third dielectric layer 216 is formed from a material with a dielectric constant (k) higher than the low-k dielectric material layers. The plurality of support structures 209, 213 and 217 form a support system that is located under the bond pad 222. A protective coating 220 is located over the conductive layer 218. The bond pad 222 is located in an opening formed in the protective coating 220. A solder bump 224 is received over the bond pad. The support structures 209, 213 and 217 in the first, second and third dielectric layers 208, 212, and 216 are located in an overlying relationship underneath the bond pad 222.

Figure 12:
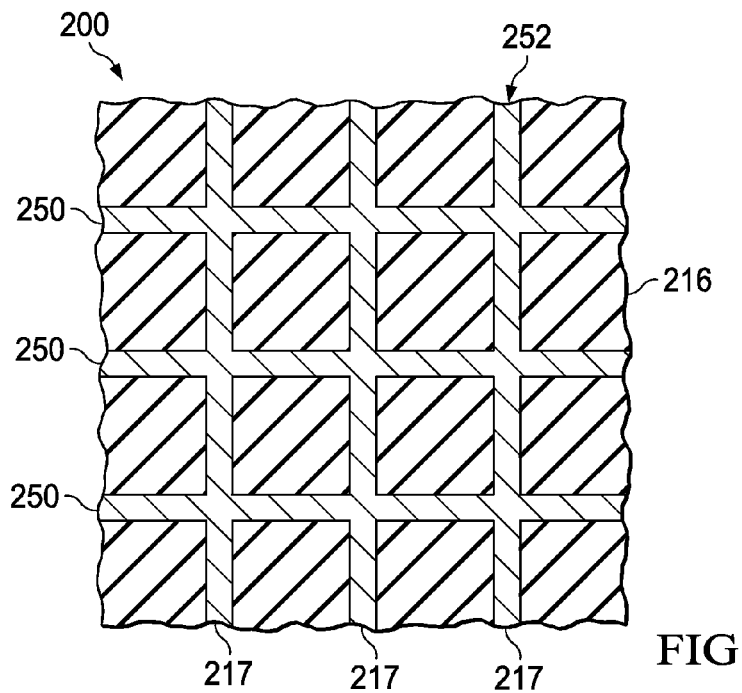
FIG. 12 illustrates a top plan view of the semiconductor device of FIG. 11.

Optionally, additional support structures can formed in the first, second, and third dielectric layers 209, 213, and 217. FIG. 12, which illustrates a top plan view of the third dielectric layer 216, shows that the support structures 250 can extend substantially perpendicular to the support structures 217 so that the support structures 217 and 250 intersect. The intersecting support structures can form a support system 252 that has a generally scaffold shape. The scaffold shaped support system 252 can provide a load bearing structure that mitigates damage to the low-k dielectric layers 208, 212, and 216 under the bond pad 222.

Figure 13:
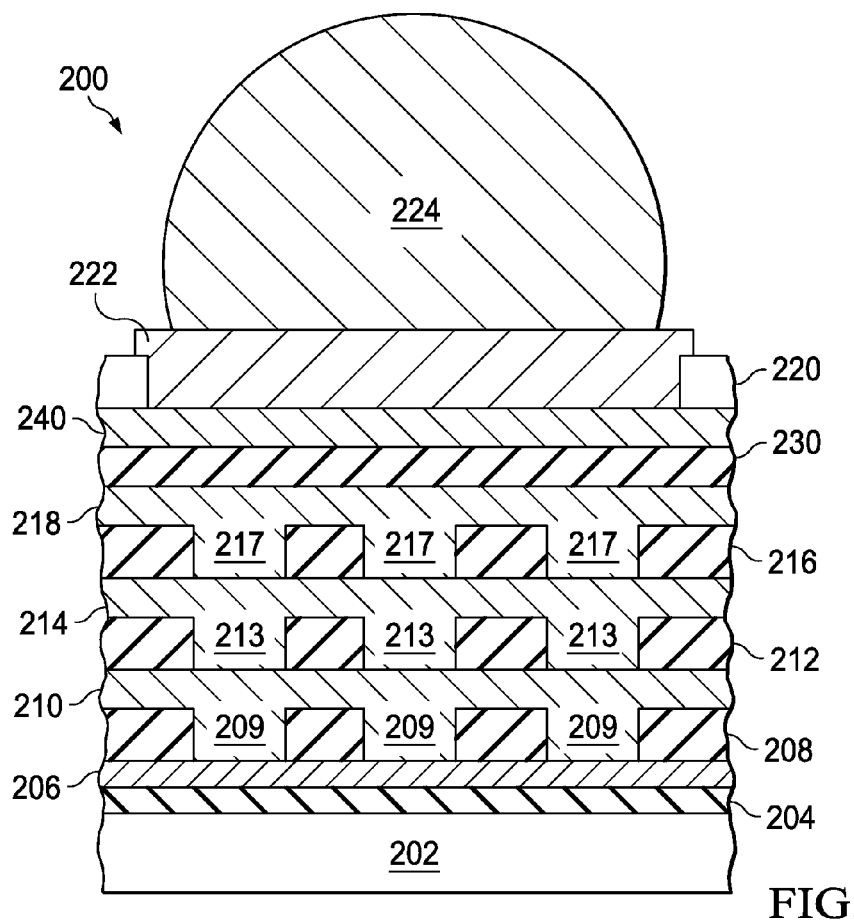
FIG. 13 illustrates a schematic cross sectional view of a semiconductor device in accordance with yet another aspect of the present invention.

FIG. 13 illustrates the semiconductor device 200 of FIG. 11 with additional layers 230 and 240 stacked in an overlying relationship over conductive layer 218. The layer 230 is a high k dielectric layer similar to high k dielectric layer 216 except that layer 230 does not include an support structures. Layer 240 is a conductive layer. Conductive layer 240 allows the bond pad 222 to be electrically connected to other locations on the semiconductor device 200 rather than directly down with respect to FIG. 13.

Figure 14:
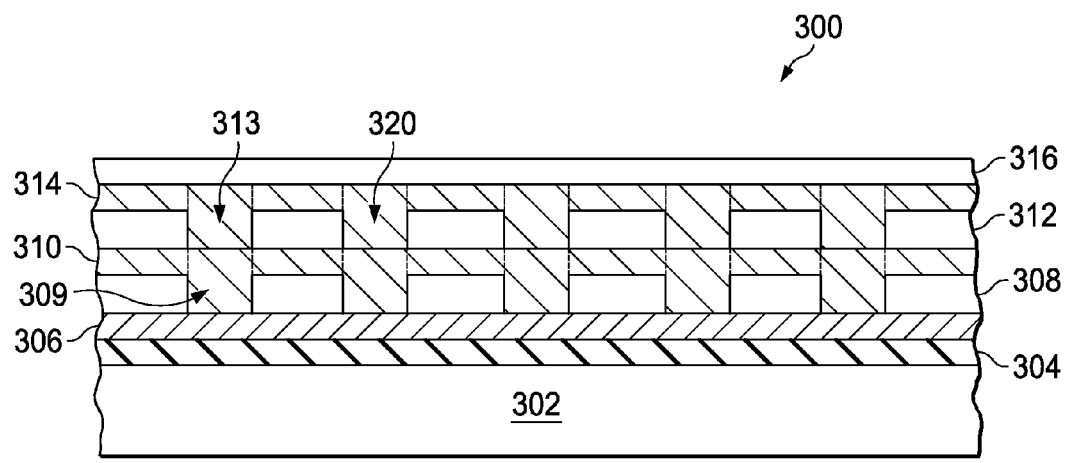
FIG. 14 illustrates a schematic cross-sectional view of a semiconductor device in accordance with yet another aspect of the present invention.

FIG. 14 illustrates a semiconductor device 300 having a multiple support structure arrangement in accordance with another aspect of the invention. The support structures can be arranged in the low-k dielectric layers at locations across substantially the entire low-k dielectric layer, not just underneath bond pads. In this manner, a plurality of support structures can extend across substantially the entire semiconductor device 300. A plasma oxide layer 304 resides on a substrate 302. A conductive layer 306 is located over the plasma oxide layer 304. A first low-k dielectric layer 308 resides over the conductive layer 306. The first low-k dielectric layer 308 includes a plurality of support structures 309 that are formed from a support material (e.g., aluminum, aluminum alloy, copper, copper alloy, tungsten, tungsten alloy) that is structurally stronger than the first low-k dielectric layer 308. A conductive layer 310 is located over the first low-k dielectric layer 308. A second low-k dielectric layer 312 resides over the conductive layer 310. The second low-k dielectric layer 312 also includes a plurality of support structures 313 that are formed from a support material (e.g., aluminum, aluminum alloy, copper, copper alloy, tungsten, tungsten alloy) that is structurally stronger than the second low-k dielectric layer 312. A conductive layer 314 resides over the second low-k dielectric layer 312. The support structures 313 in the second low-k dielectric layer 314 are aligned over support structures 309 in the first low-k dielectric layer 308 to form a plurality support columns 320.

Figure 15:
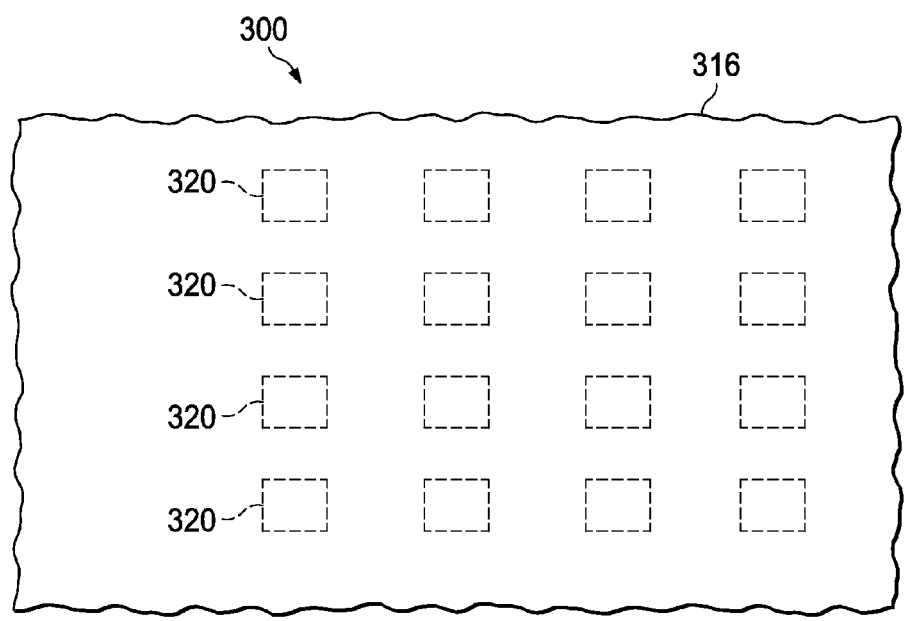
FIG. 15 illustrates a top plan view of the semiconductor device of claim 13.

Referring to FIG. 15, which is a top plan view of FIG. 14, the plurality of support columns 320 can be arranged in the semiconductor device 300 in the form of an array. The number of support columns 320 and the distance between the support columns in the semiconductor device 300 can be determined by finite stress modeling configuration to mitigate stress to the low-k ILD that could potentially be caused by mechanical forces on the semiconductor device 300.

What has been described above includes examples and implementations of the present invention. Because it is not possible to describe every conceivable combination of components, structures or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A semiconductor device comprising:
    a substrate;
    a plurality of substantially non load bearing inter-level dielectric (ILD) layers each formed of a dielectric material having a low dielectric constant (k);
    at least one load bearing support structure disposed in each of the ILD layers at locations overlying each other so that the support structures are vertically aligned with each other through the plurality of layers to mitigate structural damage of the plurality of ILD layers caused by stresses to the plurality of ILD layers;
    at least one additional ILD layer having a dielectric constant which is higher than the plurality of ILD layers, the at least one additional ILD layer overlying the plurality of ILD layers; and
    a bond pad overlying the at least one additional ILD layer and the support structures, each of the vertically aligned load bearing support structures substantially aligned with a center axis of the bond pad;
    wherein the at least one support structure is a plurality of support structures, the plurality of support structures being located directly underneath the bond pad.

2. The semiconductor device of claim 1, wherein the low dielectric constant (k) of the dielectric material of the plurality of ILD layers has a value between about 1.0 and about 3.8.

3. The semiconductor device of claim 1 wherein the at least one support structure that is a plurality of support structures comprises a first plurality of support structures extending along a length of the semiconductor device and a second plurality of support structures extending along a width of the semiconductor device, the first and second plurality of support structures intersecting perpendicularly with respect to each other.

4. A semiconductor device comprising:
a substrate;
a plurality of substantially non load bearing inter-level dielectric (ILD) layers each formed of a dielectric material having a low dielectric constant (k);
at least one load bearing support structure disposed in each of the ILD layers at locations overlying each other so that the support structures are vertically aligned with each other through the plurality of layers to mitigate structural damage of the plurality of ILD layers caused by stresses to the plurality of ILD layers;
at least one additional ILD layer having a dielectric constant which is higher than the plurality of ILD layers, the at least one additional ILD layer overlying the plurality of ILD layers;
a contact layer overlying the at least one additional ILD layer and the support structures, wherein the at least one additional ILD layer isolates the contact layer from the support structures; and
a bond pad overlying the contact layer, each of the vertically aligned load bearing support structures substantially aligned with a center axis of the bond pad;
wherein the at least one support structure is a plurality of support structures, the semiconductor device further comprising a solder bump overlying the contact surface, the plurality of support structures being located directly underneath the solder bump.

5. The semiconductor device of claim 4, wherein at least one ILD layer has an ultra low dielectric constant (k).

6. The semiconductor device of claim 5, wherein the ultra low dielectric constant (k) of the dielectric material of the plurality of ILD layers has a value between about 1.0 and about 2.7.

7. The semiconductor device of claim 4, wherein the at least one support structure is one of a trench and via formed from a support material.

8. The semiconductor device of claim 7, wherein the support material comprises at least one of aluminum, aluminum alloy, copper, copper alloy, tungsten, or tungsten alloy.

9. The semiconductor device of claim 4, wherein the support structure mitigates damage of the plurality of ILD layers due to forces applied onto the plurality of ILD layers during one of a subsequent processing and packaging of the semiconductor device.

10. The semiconductor device of claim 4, wherein the support structures are located underneath the source of the stress to mitigate damage to the semiconductor device.

11. The semiconductor device of claim 10, the source of the stress being a bond pad location.

12. The semiconductor device of claim 4, the support column ending at the at least one additional ILD layer.

13. The semiconductor device of claim 4, wherein the low dielectric constant (k) of the dielectric material of the plurality of ILD layers has a value between about 1.0 and about 3.8.

14. The semiconductor device of claim 4, wherein the at least one support structure that is a plurality of support structures comprises a first plurality of support structures extending along a length of the semiconductor device and a second plurality of support structures extending along a width of the semiconductor device, the first and second plurality of support structures intersecting perpendicularly with respect to each other.

15. A semiconductor device comprising:
a substrate;
a plurality of substantially non load bearing inter-level dielectric (ILD) layers each having a low dielectric constant (k);
a plurality of load bearing support structures disposed in each of the ILD layers at locations overlying each other so that the support structures are vertically aligned with each other through the plurality of layers to mitigate structural damage of the plurality of ILD layers caused by stresses to the plurality of ILD layers;
at least one additional ILD layer having a dielectric constant which is higher than the plurality of ILD layers, the at least one additional ILD layer overlying the plurality of ILD layers;
a contact layer overlying the at least one additional ILD layer and the support structures, wherein the at least one additional ILD layer isolates the contact layer from the support structures;
wherein the plurality of support structures are disposed in at least one of the plurality of ILD layers in an n×m matrix configuration, where n and m are integers greater than one; and
wherein each of the plurality of support structures of each matrix configuration are vertically aligned and the matrix configurations are uniformly distributed below and corresponding to a size of a bond pad disposed on the semiconductor device.

16. The semiconductor device of claim 15, wherein the plurality of support structures are disposed in the plurality of ILD layers at a plurality of locations spaced equidistant apart from each other across substantially the entirety of each of the plurality of ILD layers.

17. The semiconductor device of claim 15, wherein the low dielectric constant (k) of the dielectric material of the plurality of ILD layers has a value between about 1.0 and about 3.8.

18. The semiconductor device of claim 15, wherein the n×m plurality of support structures are configured such that the n support structures extend along a length of the semiconductor device and the m support structures extend along a width of the semiconductor device, the plurality n support structures and the plurality m support structures intersecting perpendicularly with respect to each other.

* * * * *